(12) United States Patent
Matsuki

(10) Patent No.: US 6,517,911 B1
(45) Date of Patent: Feb. 11, 2003

(54) PROCESS FOR THE FORMATION OF SILICON OXIDE FILMS

(75) Inventor: Yasuo Matsuki, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/700,726
(22) PCT Filed: Mar. 29, 2000
(86) PCT No.: PCT/JP00/01961
  § 371 (c)(1),
  (2), (4) Date: Nov. 30, 2000
(87) PCT Pub. No.: WO00/59022
  PCT Pub. Date: May 10, 2000

(30) Foreign Application Priority Data

Mar. 30, 1999 (JP) .......................................... 11-088543

(51) Int. Cl.$^7$ ................................................. B05D 3/00
(52) U.S. Cl. ..................... 427/551; 427/397.7; 427/552; 427/553; 427/558; 427/595
(58) Field of Search ................................ 427/551, 552, 427/553, 558, 595, 397.7

(56) References Cited

U.S. PATENT DOCUMENTS 5,445,894 A  8/1995  Haluska et al.

FOREIGN PATENT DOCUMENTS

| JP | 3-242933 | 10/1991 |
|----|----------|---------|
| JP | 4-334551 | 11/1992 |
| JP | 5-295563 | 11/1993 |
| JP | 7-29769  | 4/1995  |
| JP | 7-142470 | 6/1995  |
| JP | 7-235532 | 9/1995  |
| JP | 8-70000  | 3/1996  |

OTHER PUBLICATIONS

Patricia A. Bianconi, et al., J. American Chemical Society, vol. 110, No. 7, pp. 2342–2344, "Poly (η–Hexylsilyne): Synthesis and Properties of the First Alkyl Silicon [RSi]$_n$ Network Polymer", 1988 (No month avail.).

Kazuaki Furukawa, et al., Macromolecules, vol. 23, No. 14, pp. 3423–3426, "Optical Properties of Silicon Network Polymers", 1990 (No month avail.).

Koichi Mikami, et al., J. Chem. Soc., Chem. Commun., pp. 1161–1163, "Anomalous Threodiastereoslectivity in Allylic Silane– or Stannane–Aldehyde Condensation Reactions: New Interpretation of the Antiperiplanar vs. Synclinal Problem on the Transition–State Conformations", 1990 (No month avail. ).

Tatsuya Shono, et al., J. Chem. Soc., Chem. Commun., pp. 896–897, "Electroreductive Synthesis of Polygermane and Germane–Silane Copolymer", 1992 (No month avail.).

Kenkichi Sakamoto, et al., Macromolecules, vol. 23, No. 20, pp. 4494–4496, "Highly Ordered High Molecular Weight Alternating Polysilylene Copolymer Prepared by Anionic Polymerization of Masked Disilene", 1990 (No month avail.).

E. Hengge, et al., Z. Anorg. Allg. Chem., vol. 459, pp. 123–130, "Darstellung Und Charakterisierung Von Cyclohexasilan $Si_6H_{12}$", 1979 (No month avail.).

E. Hengge, et al., Monatshefte fuer Chemie, vol. 106, pp. 503–512, "Darstellung Und Eigenschaften Von Cyclopentasilan", 1975 (No month avail.).

*Primary Examiner*—Bernard Pianalto
(74) *Attorney, Agent, or Firm*—Oblon, Spivak, McClelland, Maier & Neustadt, P.C.

(57) ABSTRACT

There is provided a process for forming a silicon oxide film which is useful as an electrical insulating film, dielectric film or protective film as used in LSI, thin-film transistor, photoelectric converter, photosensitive body and the like. The process comprises forming a coating film from a polysilane compound represented by the formula $Si_nR_m$ (wherein n is an integer of 3 or more, m is an integer of n to 2n+2, and a plurality of R's are independently a hydrogen atom or an alkyl group) and oxidizing the coating film to form the silicon oxide film.

6 Claims, 2 Drawing Sheets

PROCESS FOR THE FORMATION OF SILICON OXIDE FILMS

TECHNICAL FIELD OF THE INVENTION

The present invention relates to a process for forming a silicon oxide film. More specifically, it relates to a process for forming a silicon oxide film which is useful as an electrical insulating film, dielectric film or protective film as used in LSI, thin-film transistor, photoelectric converter, photosensitive body and the like.

PRIOR ARTS

Heretofore, a silicon oxide film has been frequently used as an electrical insulating film, dielectric film or protective film in silicon devices including a semiconductor. In general, as processes for forming these silicon oxide films, there have been known dry processes such as one comprising thermal oxidizing silicon in the air, one comprising forming the film by plasma CVD using a silane gas or a disilane gas in an oxidizing gas such as oxygen or nitric oxide, and one comprising forming the film directly from quartz by sputtering; and wet processes such as one comprising coating alkoxysilane such as tetraethoxysilane in a partially hydrolyzed sol state on a substrate and thermally decomposing it.

However, of these processes, the above dry processes to form a silicon oxide film have the following problems; that is, (a) since it is a gas phase reaction, the generation of particles of impurities in a gas phase causes the contamination of an apparatus or the inclusion of foreign matters, thereby causing low production yield, (b) since the material is in gaseous form, it is difficult to form a film having a uniform thickness on a substrate whose surface is not smooth, (c) productivity is low because the formation of the film is slow, (d) complicated and expensive radio-frequency generator and vacuum apparatus are required in the case of plasma CVD, and (e) they cannot be easily applied to a substrate having a large area.

Further, in these dry processes, since gaseous silicon hydride which is highly toxic and highly reactive is used as the material, it not only is difficult to handle but also requires a sealed vacuum apparatus since it is in gaseous form. In general, these apparatus not only are bulky and expensive but also consume a large amount of energy in a vacuum or plasma system, causing an increase in product cost.

Meanwhile, the above wet process system using a sol-gel reaction is a process which comprises heating a partially hydrolyzed alkoxysilane to cause its dehydration-condensation reaction. Thus, since water is produced as the reaction proceeds, a compact silicon oxide film cannot be easily obtained, and cracks are liable to be produced due to the occurrence of the internal stress of the film. Further, since the sol-gel reaction requires a high temperatures heating, the process cannot be applied to a plastic substrate having low heat resistance.

Further, JP-B 7-297669 discloses that a silicon oxide film is formed from a film formed of an amic acid containing hydrolyzable silicon atoms by irradiation of ultraviolet light in the presence of ozone. In this process, since a silicon compound containing an amic acid having high heat resistance as an organic component is used as the precursor of the silicon oxide film, the film can be made thick. This process, however, has a point to be improved, which is low productivity caused by a large amount of ultraviolet light required to oxidize and decompose the organic component.

DISCLOSURE OF THE INVENTION

It is an object of the present invention to provide a novel process for forming a silicon oxide film.

It is another object of the present invention to provide a process for forming a silicon oxide film that is suitably used particularly for producing a device having a compact silicon oxide film on a substrate having a large area.

It is still another object of the present invention to provide a process for forming a silicon oxide film easily, which comprises forming a film from the precursor of a silicon oxide film and processing the precursor film in the presence of oxygen and/or ozone.

Still other objects and advantages of the present invention will be apparent from the following description.

According to the present invention, the above objects and advantages of the present invention are achieved by a process for forming a silicon oxide film, comprising:

(1) forming a coating film from at least one polysilane compound selected from the group consisting of cyclotrisilane, cyclotetrasilane, cyclopentasilane, silylcyclopentasilane, cyclohexasilane, cycloheptasilane, monomethylcyclotrisilane, monomethylcyclotetrasilane, monomethylcyclopentasilane, monomethylcyclohexasilane, monomethylcycloheptasilane, monomethylcyclooctasilane, dimethylcyclotrisilane, dimethylcyclotetrasilane, dimethylcyclopentasilane, dimethylcyclohexasilane, dimethylcycloheptasilane, dimethylcyclooctasilane, 1,1'-biscyclobutasilane, 1,1'-biscyclopentasilane, 1,1'-bissilylcyclopentasilane. 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2.2]pentasilane, spiro[3.3]heptasilane, spiro[4.4]nonasilane, spiro[4.5]decasilane, spiro[4.6]undecasilane, spiro[5.5]undecasilane, spiro[5.6]undecasilane, spiro[6.6]tridecasilane, hexasila[3]prismane, octasila[4]prismane, decasila[5]prismane, dodecasila[6]prismane, tetradecasila[7]prismane, silicon compounds obtained by partially substituting hydrogen atoms of said bicyclosilanes with alkyl groups, silicon compounds obtained by partially substituting hydrogen atoms of said spirosilanes with alkyl groups and silicon compounds obtained by partially substituting hydrogen atoms of said silaprismanes with alkyl groups; and (2) oxidizing the coating film by at least one oxidant selected from the group consisting of oxygen and ozone to convert it into a silicon oxide film.

Figure 1:
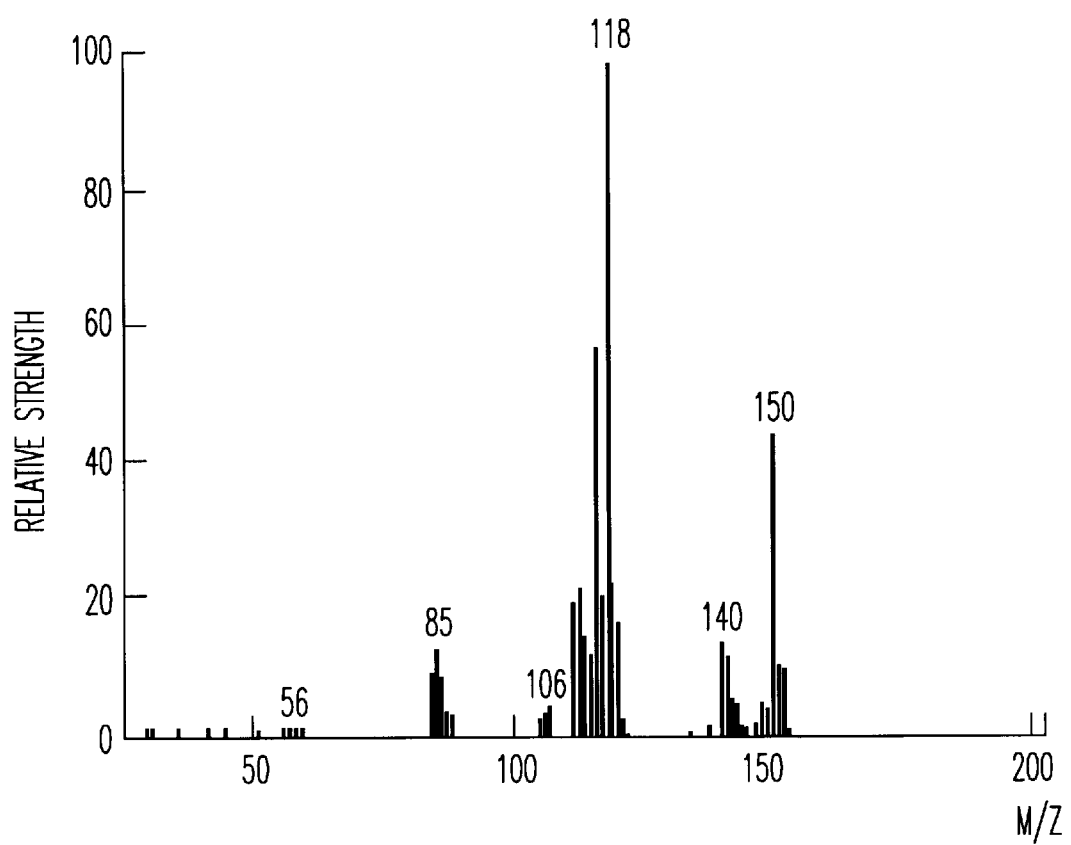
FIG. 1 shows the MS spectrum of the cyclopentasilane obtained in Synthesis Example 2.

The present invention will be described in detail hereinafter. The polysilane compound in the step (1) of the present invention is selected from the group consisting of cyclotrisilane, cyclotetrasilane, cyclopentasilane, silylcyclopentasilane, cyclohexasilane, cycloheptasilane, monomethylcyclotrisilane, monomethylcyclotetrasilane, monomethylcyclopentasilane, monomethylcyclohexasilane, monomethylcycloheptasilane, monomethylcyclooctasilane, dimethylcyclotrisilane, dimethylcyclotetrasilane, dimethylcyclopentasilane, dimethylcyclohexasilane, dimethylcycloheptasilane, dimethylcyclooctasilane, 1,1'-biscyclobutasilane, 1,1'-biscyclopentasilane, 1,1'-bissilylcyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2.2]pentasilane, spiro[3.3]heptasilane, spiro[4.4]nonasilane, spiro[4.5]decasilane, spiro[4.6]undecasilane, spiro[5.5]undecasilane, spiro[5.6]undecasilane, spiro[6.6]tridecasilane, hexasila[3]prismane, octasila[4]prismane, decasila[5]prismane, dodecasila[6]prismane, tetradecasila[7]prismane, silicon compounds obtained by partially substituting hydrogen atoms of said bicyclosilanes with alkyl groups, silicon compounds obtained by partially substituting hydrogen atoms of said spirosilanes with alkyl groups and silicon compounds obtained by partially substituting hydrogen atoms of said silaprismanes with alkyl groups. In view of the thermodynamic stability, solubility and ease of purification of the polysilane compound, a cyclic silicon compound with 5 to about 20 silicon atoms is preferable as the polysilane compound. When less than 5 silicon atoms are present, the silicon compound itself becomes unstable due to the distortion of the ring and difficult to handle. On the other hand, when more than 20 silicon atoms are present, a decrease in solubility attributed to the cohesion of the silicon compound can be recognized, whereby the number of solvents that can be selected becomes smaller disadvantageously.

The plurality of R's are independently a hydrogen atom or an alkyl group. When the polysilane compound is thermally and/or optically treated, the silicon-silicon bonds, silicon-hydrogen bonds and silicon-carbon bonds of the polysilane compound are cleaved to form silicon-oxygen bonds, and the polysilane compound is eventually converted into a silicon oxide film. Preferable examples of the alkyl group include linear, branched or cyclic alkyl groups having 1 to 10 carbon atoms such as methyl, ethyl, n-propyl, i-propyl, n-butyl, sec-butyl, t-butyl, n-pentyl, i-pentyl, neo-pentyl, n-hexyl, cyclohexyl, n-heptyl, n-octyl, n-nonyl and n-decyl groups. A polysilane compound in which some of the plurality of R's bonded to silicon atoms are hydrogen and others are alkyl groups may be used. The total number of R's, m, is an integer of n to 2n+2.

Illustrative examples of the polysilane compound include hydrogenated monocyclic polysilane compounds such as cyclotrisilane, cyclotetrasilane, cyclopentasilane, silylcyclopentasilane, cyclohexasilane and cycloheptasilane; methylated monocyclic polysilane compounds such as monomethylcyclotrisilane, monomethylcyclotetrasilane, monomethylcyclopentasilane, monomethylcyclohexasilane, monomethylcycloheptasilane, monomethylcyclooctasilane, dimethylcyclotrisilane, dimethylcyclotetrasilane, dimethylcyclopentasilane, dimethylcyclohexasilane, dimethylcycloheptasilane and dimethylcyclooctasilane; bicyclic hydrogenated silicon compounds such as 1,1'-biscyclobutasilane, 1,1'-biscyclopentasilane, 1,1'-bissilylcyclopentasilane, 1,1'-biscyclohexasilane, 1,1'-biscycloheptasilane, 1,1'-cycyclobutasilylcyclopentasilane, 1,1'-cycyclobutasilylcyclohexasilane, 1,1'-cycyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2.2]pentasilane, spiro[3.3]heptasilane, spiro[4.4]nonasilane; spiro[4.5]decasilane, spiro[4.6]undecasilane, spiro[5.5]undecasilane., spiro[5.6]undecasilane and spiro[6.6]tridecasilane; polycyclic hydrogenated silicon compounds such as hexasila[3]prismane, octasila[4]prismane, decasila[5]prismane, dodecasila[6]prismane and tetradecasila[7]prismane; and silicon compounds obtained by partially substituting hydrogen atoms of these bicyclic or polycyclic hydrogenated silicon compounds with alkyl groups. These polysilane compounds can be used solely or in admixture of two or more.

Of these polysilane compounds, the cyclic polysilane compound represented by the formula $Si_pH_p$ (wherein p is an integer of 6 to 14) or the formula $Si_qH_{2q}$ (wherein q is an integer of 4 to 6) form the viewpoints of solubility and film-formability is preferable.

Further, these polysilane compounds may be mixed as appropriate with fine particles of metal oxides such as aluminum oxide, zirconium oxide, titanium oxide and silicon oxide as required for the purposes of improving the crack resistance, chemical resistance, hardness and adhesion of the obtained silicon oxide film and keeping the film antistatic.

The polysilane compounds used in the present invention as described above can be generally produced, using monomers having their own structural units as raw materials, for example, by the following processes; that is, (a) a process comprising polycondensing a halosilane by dehalogenation in the presence of an alkali metal (i.e., "Kipping process", refer to J. Am. Chem. Soc., 110 , 124(1988) and Macromolecules, 23, 3423(1990)), (b) a process comprising polycondensing a halosilane by dehalogenation under electrolytic reduction (refer to J. Chem. Soc., Chem. Commun., 1161(1990) and J. Chem. Soc., Chem. Commun., 897 (1992)), (c) a process comprising polycondensing a hydrosilane by dehydrogenation in the presence of a metal catalyst (refer to Japanese Patent Laid-Open Publication No. 4-334551), (d) a process comprising anionic polymerizing biphenyl-crosslinked disilane (refer to Macromolecules, 23, 4494(1990)), and (e) a process comprising synthesizing a phenyl- or alkylsubstituted cyclic silicon compound by the above processes and deriving hydro-substitution product or halogen-substitution product thereof by conventional processes (for example, Z. Anorg. All. Chem., 459, 123–130 (1979)). These cyclosilane compounds can be synthesized by conventional processes (for example, refer to E. Hengge et al., Mh. Chem. vol. 106, p.503, 1975).

In the above step (1), the above polysilane compound is allowed to form a coating film by coating a solution obtained by dissolving the compound in a solvent. The solvent may be any solvent that can dissolve the polysilane compound and does not react with it. Illustrative examples of the solvent include hydrocarbon solvents such as n-pentane, n-hexane, n-heptane, n-octane, decane, dicyclopentane, benzene, toluene, xylene, durene, indene, tetrahydronaphthalene, decahydronaphthalene and squalane; ether solvents such as diethyl ether, dipropyl ether, ethylene glycol dimethyl ether, ethylene glycol diethyl ether, ethylene glycol methylethyl ether, diethylene glycol dimethyl ether, diethylene glycol diethyl ether, diethylene glycol methylethyl ether, tetrahydrofuran, tetrahydropyran, 1,2-dimethoxyethane, bis(2-methoxyethyl)ether, p-dioxane and tetrahydrofuran; aprotic solvents such as propylene carbonate, γ-butyrolactone, N-methyl-2-pyrrolidone, dimethyl formamide, acetonitrile, dimethyl sulfoxide, methylene chloride and chloroform. Of these, hydrocarbon solvents and ether solvents are preferable from the viewpoints of the solubility of the cyclic silicon compound and the stability of the solution. Of the two, hydrocarbon solvents are more preferable. These solvents can be used solely or in admixture of two or more.

The concentration of the above solution of the polysilane compound is preferably about 1 to about 50 wt % and can be adjusted as appropriate according to a desired silicon film thickness. To the solution, a fluoride-based, silicon-based or nonionic surface tension regulator can be added as required in such a small amount that does not impair functions as the objects of the present invention. Particularly, the nonionic surface tension regulator is preferable because it is useful for improving the wettability of the solution to the material to be coated and the leveling of the coating film and for preventing the occurrence of protrusions or orange peel on the coating film.

Preferable examples of the nonionic surfactant include a fluoride-containing surfactant containing a fluoroalkyl group or per fluoroalkyl group or a polyether alkyl surfactant containing an oxyalkyl group. Illustrative examples of the above fluoride-containing surfactant include $C_9F_{19}CONHC_{12}H_{25}$, $C_8F_{17}SO_2NH—(C_2H_4O)_6H$, $C_9F_{17}O$ (Pluronic L-35)$C_9F_{17}$, $C_9F_{17}O$(Pluronic P-84)$C_9F_{17}$ and $C_9F_7O$(Tetronic-704)$(C_9F_{17})_2$ (wherein Pluronic L-35: product of Asahi Denka Kogyo Co., Ltd., polyoxypropylene-polyoxyethylene block copolymer having an average molecular weight of 1,900; Pluronic P-84: product of Asahi Denka Kogyo Co., Ltd., polyoxypropylene-polyoxyethylene block copolymer having an average molecular weight of 4,200; Tetronic-704: product of Asahi Denka Kogyo Co., Ltd., N,N,N',N'-tetrakis (polyoxypropylene-polyoxyethylene block copolymer) having an average molecular weight of 5,000).

Specific examples of the fluoride-containing surfactants include, presented by trade names, FTOP EF301, FTOP EF303 and FTOP EF352 (products of Shin Akita Kasei Co., Ltd.), MEGAFAC F171 and MEGAFAC F173 (products of Dainippon Ink and Chemicals, Incorporated), ASAHI GUARD AG710 (product of Asahi Glass Company), FLORADE FC-170C, FLORADE FC-430 and FLORADE FC-431 (products of SUMITOMO 3M LIMITED), SURFLON S-382, SURFLON SC101, SURFLON SC102, SURFLON SC103, SURFLON SC104, SURFLON SC105 and SURFLON SC106 (products of Asahi Glass Company), BM-1000 and BM-1100 (products of B.M-Chemie Co., Ltd.), and Schsego-Fluor (Schwegmann Co., Ltd.).

Illustrative examples of the polyether alkyl surfactant include polyoxyethylene alkyl ether, polyoxyethylene allyl ether, polyoxyethylene alkyl phenol ether, polyoxyethylene fatty acid ester, sorbitan fatty acid ester, polyoxyethylene sorbitan fatty acid ester and oxyethylene oxypropylene block polymer.

Specific examples of the polyether alkyl surfactants include, presented by trade names, EMALGEN 105, EMALGEN 430, EMALGEN 810, EMALGEN 920, REODOLE SP-40S, REODOLE TW-L120, EMANOLE 3199, EMANOLE 4110, EXEL P-40S, BRIDGE 30, BRIDGE 52, BRIDGE 72, BRIDGE 92, ARACEL 20, EMASOLE 320, TWEEN 20, TWEEN 60 and MERGE 45 (products of Kao Corporation), and NONIBOL 55 (product of Sanyo Chemical Industries, Ltd.). Illustrative examples of nonionic surfactants other than those listed above include polyoxyethylene fatty acid ester, polyoxyethylene sorbitan fatty acid ester and polyalkyleneoxide block copolymer. Specific examples thereof include CHEMISTAT 2500 (product of Sanyo Chemical Industries, Ltd.), SN-EX9228 (SAN NOPCO LTD.) and NONALE 530 (Toho Chemical Industries Co., Ltd.). The nonionic surfactant is used in an amount of preferably 0.01 to 10 parts by weight, particularly preferably 0.1 to 5 parts by weight, based on 100 parts by weight of the total of the polysilane compound and the solvent. When the amount is less than 0.01 parts by weight, the effect of the nonionic surfactant is not exhibited. On the other hand, when it is larger than 10 parts by weight, the obtained composition is liable to foam and may be thermally discolored disadvantageously.

Further, the polysilane solution composition used in conducting the step (1) may contain an anionic surfactant or a cationic surfactant instead of the above nonionic surfactant. Further, to the above solution composition, colloidal silica dispersed in water and/or a hydrophilic organic solvent may also be added. The colloidal silica is used for increasing the solid content of the above polysilane solution composition, and the thickness of the coating film obtained can be controlled by the amount of this component.

When colloidal silica is used, it is preferable that a solvent be selected and used in consideration of compatibility with colloidal silica. Further, the polysilane solution composition may be mixed as appropriate with fine particles of metal oxides such as aluminum oxide, zirconium oxide and titanium oxide for the purposes of preventing the gelation of the composition, thickening the composition, improving the heat resistance, chemical resistance, hardness and adhesion of the cured product obtained and keeping the cured product antistatic.

When the step (1) is conducted, the polysilane solution composition is coated on a substrate by such methods as spray coating, roll coating, curtain coating, spin coating, screen printing, offset printing and ink-jet printing in such an amount that the coating film should have a thickness of preferably 0.01 to 10 $\mu$m, particularly preferably 0.1 to 5 $\mu$m when dried. By heating the substrate in the air using such heating means as hot plate or oven at temperatures of preferably 50 to 300° C., more preferably 100 to 200° C., for 10 to 120 minutes, a coating film comprising the polysilane compound can be formed.

Next, in the step (2) of the present invention, the obtained coating film is oxidized by at least either one of oxygen and ozone as an oxidant to convert the film into a silicon oxide film.

This oxidization is carried out preferably together with heat treatment, radiation treatment or steam treatment, more preferably together with heat treatment or radiation treatment. These treatments may be carried out under normal, increased or decreased pressure. As for the radiation, visible light, ultraviolet light, far ultraviolet light, electron beam, X-ray or the like can be used.

Further, the oxidization is carried out in an atmosphere containing at least either one of oxygen and ozone.

When the oxidization is carried out together with heat treatment, the temperature at which they are carried out is preferably 100 to 800° C., more preferably 200 to 600° C., much more preferably 300 to 500° C., in the air. When the temperature is lower than 100° C., the oxidization reaction of the polysilane compound does not proceed sufficiently, while when it is higher than 800° C., the film is liable to be cracked.

When the oxidization is carried out together with irradiation of radiation such as ultraviolet light, the polysilane compound is converted into the silicon oxide coating film through the conversion of the polysilane compound into a strong coating film by the cleavage reaction of silicon-silicon bonds and the formation of silicon-oxygen bonds.

The light source used in the present invention may be a low-pressure or high-pressure mercury lamp, a deuterium lamp, discharge light of noble gases such as argon, krypton and xenon, a YAG laser, an argon laser, a carbon dioxide gas laser, and excimer lasers such as XeF, XeCl, XeBr, KrF, KrCl, ArF and ArCl. These light sources generally have an output of 10 to 5,000 W. An output of 100 to 1,000 W is generally sufficient. The wavelengths of these light sources are not limited to a particular range as long as they can be more or less absorbed by the coating films of the cyclic silicon compound and the optically ring-opened silicon compound but are preferably 170 to 600 nm. Further, the use of laser light is particularly preferable from the viewpoint of the efficiency of conversion into the silicon film. The temperature at which these lights are irradiated is preferably from 15 to 500° C. and can be selected within this temperature range as appropriate according to the properties of the obtained silicon oxide film.

A silicon oxide film can be formed by the process of the present invention. The process of the present invention keeps production costs low because it does not require expensive apparatus such as vacuum apparatus. Further, when radiation such as ultraviolet light is irradiated, an oxidization reaction can occur uniformly in minute portions, thereby making the texture of the film uniform and compact. Further, since the processof the present invention is capable of causing the oxidization reaction at low temperatures, unlike the conventional process which requires heating at high temperatures of 400° C. or higher, it rarely limits the kinds of substrates that can be selected. Furthermore, when radiation such as ultraviolet light is selectively irradiated, it is possible to selectively form a silicon oxide film in the cured film of a silicon-containing organic compound. That is, it is possible to form thin film portions formed of the silicon oxide film in any pattern by varying the thickness of the insulating film appropriately.

The substrate used in forming the silicon oxide film of the present invention is not particularly limited in kind. As the substrate, in addition to commonly used quartz, borosilicate glass and soda glass, there can also be used metal substrates such as gold, silver, copper, nickel, titanium, aluminum, tungsten and silicon; and glass and plastic substrates covered with these metals.

EXAMPLES

The present invention will be described in detail with reference to the following Examples. The present invention, however, shall not be limited to these Examples in any way.

Synthesis Example 1

The inside of a 2-liter four-neck flask equipped with a thermometer, a condenser, a dropping funnel and an agitator was substituted with an argon gas, 1.5 liters of dried tetrahydrofuran and 27.4 g of metal lithium were then charged into the flask, and the content of the flask was bubbled with an argon gas. While this suspension was cooled with ice under agitation, 500 g of diphenyldichlorosilane was added through the dropping funnel. The reaction was continued until the metal lithium completely disappeared. Thereafter, the reaction mixture was poured into ice water to precipitate the reaction product. This precipitate was separated by filtration and washed fully with water and then with cyclohexane. Further, this crude product was recrystallized from ethyl acetate to give 216 g of undecaphenylcyclohexasilane. Its structure was checked by TOF-MS, NMR and IR. Then, 200 g of dodecaphenylcyclohexasilane and 2,500 ml of toluene were charged into a 1-liter flask, 5 g of aluminum chloride was added, hydrogen chloride was introduced while the flask was cooled with ice, and the reaction mixture was condensed under reduced pressure in an argon atmosphere to give 92 g of a solid reaction mixture. This crude product was purified in an argon atmosphere by solid distillation under reduced pressure to give 75 g of a chlorinated cyclosilane. This was found to be $Si_6Cl_{12}$ by MS, $^{29}Si$—NMR and IR spectra. Sixty six grams of the thus-obtained dodecachlorocyclohexasilane was dissolved in a mixed solvent of ether and toluene, and 1 equivalent of a lithium aluminum hydride was added per chlorine atom in an argon atmosphere while the mixture was cooled with ice to cause a reduction reaction. The aluminum compound produced by the reaction was removed to give 18 g of the reduced silane compound. This was found to be $Si_6H_{12}$ by MS, $^{29}Si$—NMR and IR spectra.

Synthesis Example 2

The recrystallization mother liquor of the dodecaphenylcyclohexasilane of Synthesis Example 1 was further purified by the method of chromatography to give 55 g of decaphenylcyclopentasilane as a side product. Using this side product, 25 g of decachloropentasilane was obtained under the same reaction condition as in Synthesis Example 1. The decachloropentasilane was reduced to give 6 g of cyclopentasilane($Si_5H_{10}$). The production thereof was checked by MS, $^{29}Si$—NMR and IR spectra. The MS spectrum thereof is shown in FIG. 1.

Synthesis Example 3

Figure 2:
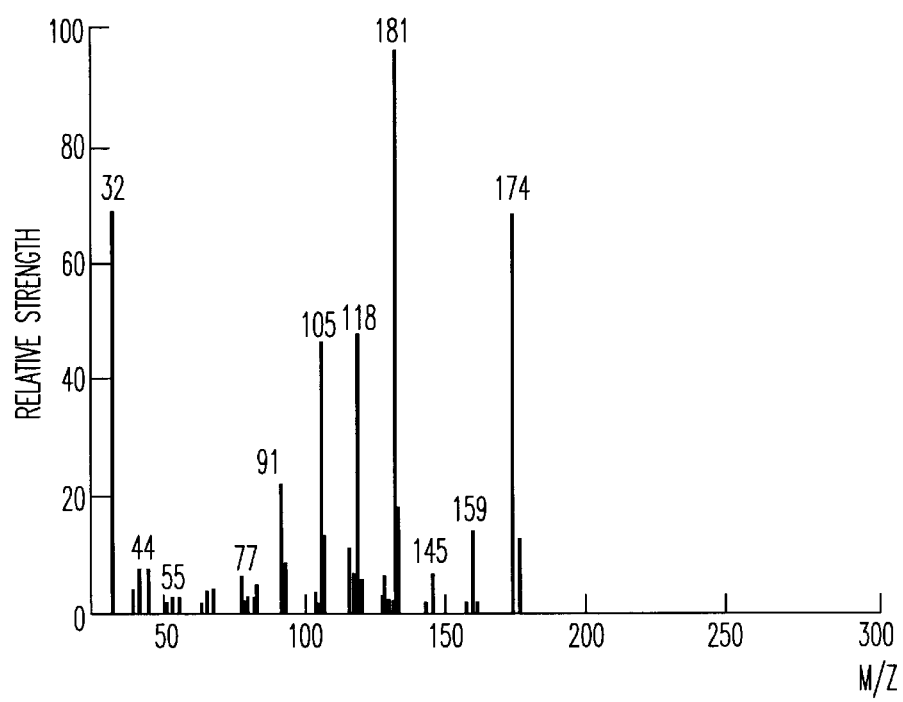
FIG. 2 shows the MS spectrum of the polysilane obtained in Synthesis Example 3.

The inside of a 3-liter four-neck flask equipped with a thermometer, a condenser, a dropping funnel and an agitator was substituted with an argon gas, 2 liters of dried tetrahydrofuran and 75 g of metal lithium were then charged into the flask, and the content of the flask was bubbled with an argon gas. While this suspension was agitated at 0° C., 500 g of phenyltrichlorosilane was added through the dropping funnel. The reaction was continued at 0° C. until the metal lithium completely disappeared and, thereafter, the content of the flask was further agitated at room temperature for 12 hours. The dark-brown reaction mixture was poured into ice water to precipitate the reaction product. This precipitate was separated by filtration, washed fully with water and vacuum dried to give 210 g of a phenyl group-containing polycyclic silicon compound. A hundred fifty grams of the phenyl group-containing polysilane compound was caused to be suspended in 2 liters of toluene, 5 g of aluminum chloride was added thereto, and a dried hydrogen chloride gas was then introduced until the reaction system became transparent. After the completion of the reaction, the aluminum compound was removed therefrom. Thereafter, the solvent was separated by distillation under reduced pressure to give 85 g of the crude product of the chlorinated polycyclic silicon compound from which the phenyl group had been removed. This chlorinated compound, without purifying it, was dissolved in a mixed solvent of 250 ml of diethyl ether and 250 ml of toluene in an argon atmosphere. Fifteen grams of a lithium aluminum hydride was added to the resulting mixture while the mixture was agitated at 0° C. The mixture was agitated for another 3 hours. Thereafter, the mixture was gradually heated to room temperature and agitated for another 6 hours. The aluminum compound was separated from the reaction mixture by filtration, and the filtrate was condensed and purified to give 21 g of the target hydrogenated polysilane compound ($Si_6H_6$). The MS spectrum thereof is shown in FIG. 2.

Example 1

A solution was prepared by dissolving 4 g of the hydrogenated polysilane obtained in the above Synthesis Example 1 in 10 g of toluene. This solution was spin-coated on a quartz substrate on which gold had been vapor-deposited in an argon atmosphere, dried at 150° C. in the air, and thermally decomposed at 500° C. in the air to give a silicon oxide film having a film thickness of 750 angstrom. This film was a good film on which no film abnormalities such as cracks were observed. When this silicon oxide film was subjected to surface composition analysis by ESCA, only silicon atoms were detected. Further, since the energy in the 2p orbit of this silicon was 104 eV, the film was found to be an $SiO_2$ film.

Example 2

A silicon compound solution was prepared by dissolving 5 g of the hydrogenated polysilane obtained in the above Synthesis Example 3 in 10 g of tetrahydronaphthalene. This solution ink was pattern-coated on a quartz substrate on which gold had been vapor-deposited in an argon atmosphere by using an ink-jet head comprising a piezoelectric element. This substrate was dried at 150° C. in the air, thermally decomposed at 500° C. in the air, and irradiated with ultraviolet light from a 500-W high-pressure mercury lamp in the air for 10 minutes to give a silicon oxide film having a film thickness of 450 angstrom. This film was a good film on which no film abnormalities such as cracks were observed. When this silicon oxide film was subjected to surface composition analysis by ESCA, only silicon atoms were detected. Further, since the energy in the 2p orbit of this silicon was 104 eV, the film was found to be an $SiO_2$ film.

Example 3

A solution was prepared by dissolving a mixture of 2 g of the hydrogenated polysilane compound obtained in the above Synthesis Example 1, 2 g of the hydrogenated polysilane compound obtained in Synthesis Example 2 and 2 g of the hydrogenated polysilane compound obtained in Synthesis Example 3 in 12 g of toluene. This solution ink was dip-coated on a polyimide film in an argon atmosphere. The solvent was removed from the substrate, which was then dried at 100° C. to obtain a hydrogenated polysilane film having a film thickness of 1,500 angstrom. This polysilane film was irradiated with an XeCl excimer laser having a wavelength of 308 nm at an intensity of 300 mJ/cm$^2$ in the air to give a silicon oxide film having a film thickness of 1,400 angstrom.

This film was a good film on which no film abnormalities such as cracks were observed. When this silicon oxide film was subjected to surface composition analysis by ESCA, only silicon atoms were detected. Further, since the energy in the 2p orbit of this silicon was 104 eV, the film was found to be an $SiO_2$ film.

Example 4

When the etching speed (at the ratio $HF/H_2O$ of 1/200) of the silicon oxide film obtained in Example 1 was measured, it was 200 angstrom/min. In this regard, when the silicon oxide film prepared by the sol-gel process in Comparative Example 1 was etched under the same condition, the etching speed was 500 angstrom/min.

Comparative Example 1

The silanol compound obtained by partially hydrolyzing a tetraethoxysilane in ethanol and heated to be in a sol state was spin-coated on a quartz substrate on which gold had been vapor-deposited. The substrate was then heat-treated at 200° C. for an hour to obtain a 3,000-angstrom silicon oxide film. The film had a number of fine cracks.

As has been detailed, according to the present invention, there is provided a process for forming a silicon oxide film by employing a new material and process using the addition reaction of oxygen, which is different from a process for forming a silicon oxide film by a condensation reaction such as the conventionally used sol-gel process. Further, by oxidizing a precursor film formed from a polysilane compound not by the deposition from a vapor phase as in the conventional CVD process but by a coating process, the film can be converted into a silicon oxide film having uniform and compact texture at low costs.

In the present invention, unlike the conventional CVD process, the generation of powder at the time of forming a silicon oxide film can be prevented and no expensive apparatus is required because it does not employ a large-scale vacuum process. Further, according to the present invention, a film can be easily formed on a substrate with a large area, and since a pattern which is directly pattern-coated using an ink-jet process or the like can be converted into a silicon oxide film, a silicon oxide film pattern can be formed without going through processes of photolithography and etching. Consequently, it is made possible by the present invention to produce semiconductor devices such as LSI, thin-film transistor, photoelectric converter, photosensitive body and the like by an energy-efficient process.

What is claimed is:

1. A process for forming a silicon oxide film, comprising:
    (1) forming a coating film from at least one polysilane compound selected from the group consisting of cyclotrisilane, cyclotetrasilane, cyclopentasilane, silylcyclopentasilane, cyclohexasilane, cycloheptasilane, monomethylcyclotrisilane, monomethylcyclotetrasilane, monomethylcyclopentasilane, monomethylcyclohexasilane, monomethylcycloheptasilane, monomethylcyclooctasilane, dimethylcyclotrisilane, dimethylcyclotetrasilane, dimethylcyclopentasilane, dimethylcyclohexasilane, dimethylcycloheptasilane, dimethylcyclooctasilane, 1,1'-biscyclobutasilane, 1,1'-biscyclopentasilane, 1,1'-bissilylcyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2.2]pentasilane, spiro[3.3]heptasilane, spiro[4.4]nonasilane, spiro[4.5]declasmane, spiro[4.6]undecasilane, spiro[5.5]undecasilane, spiro[5.6]undecasilane, spiro[6.6]tridecasilane, hexasila[3]prismane, octasila[4]prismane, decasila[5]prismane, dodecasila[6]prismane, tetradecasila[7]prismane, silicon compounds obtained by partially substituting hydrogen atoms of said bicyclosilanes with alkyl groups, silicon compounds obtained by partially substituting hydrogen atoms of said spirosilanes with alkyl groups and silicon compounds obtained by partially substituting hydrogen atoms of said silaprismanes with alkyl groups; and
    (2) oxidizing the coating film by at least one oxidant selected from the group consisting of oxygen and ozone to convert it into the silicon oxide film.

2. The process of claim 1, wherein the formation of the coating film from the polysilane compound in the step (1) is conducted using a solution composition obtained by dissolving the polysilane compound in a solvent.

3. The process of claim 2, wherein the solvent is at least one selected from the group consisting of hydrocarbon solvents, ether solvents and aprotic solvents.

4. The process of claim 1, wherein the oxidization of the coating film in the step (2) is conducted together with heat treatment, radiation treatment or steam treatment.

5. The process of claim 1, wherein the oxidization in the step (2) is conducted while heat treatment is conducted in the air at temperatures of 100 to 800° C.

6. The process of claim 1, wherein the oxidization in the step (2) is conducted while radiation is irradiated in the air at temperatures of 15 to 500° C.

* * * * *

UNITED STATES PATENT AND TRADEMARK OFFICE
CERTIFICATE OF CORRECTION

PATENT NO. : 6,517,911 B1 Page 1 of 1
DATED : February 11, 2003
INVENTOR(S) : Matsuki It is certified that error appears in the above-identified patent and that said Letters Patent is hereby corrected as shown below:

<u>Title page,</u>
Item [87], the PCT Publication Date is incorrect. It should read:

-- [87] PCT Pub. No.: WO00/59022
PCT Pub. Date: Oct. 5, 2000 --

Signed and Sealed this

Seventeenth Day of June, 2003

JAMES E. ROGAN
*Director of the United States Patent and Trademark Office*